(12) United States Patent
Giannantonio et al.

(10) Patent No.: US 8,911,862 B2
(45) Date of Patent: Dec. 16, 2014

(54) GETTER SYSTEMS COMPRISING ONE OR MORE DEPOSITS OF GETTER MATERIAL AND A LAYER OF MATERIAL FOR THE TRANSPORT OF WATER

(75) Inventors: Roberto Giannantonio, Oleggio (IT); Giorgio Longoni, Monza (IT); Chiara Vescovi, Venegono Inferiore (IT); Lorena Cattaneo, Busto Arsizio (IT)

(73) Assignee: Saes Getters S.p.A., Lainate (MI) (IT)

( * ) Notice: Subject to any disclaimer, the term of this patent is extended or adjusted under 35 U.S.C. 154(b) by 406 days.

(21) Appl. No.: 11/995,269

(22) PCT Filed: Jul. 19, 2006

(86) PCT No.: PCT/IT2006/000546
§ 371 (c)(1),
(2), (4) Date: Jan. 10, 2008

(87) PCT Pub. No.: WO2007/013120
PCT Pub. Date: Feb. 1, 2007

(65) Prior Publication Data
US 2008/0226902 A1 Sep. 18, 2008

(30) Foreign Application Priority Data
Jul. 29, 2005 (IT) .............................. MI2005A1502

(51) Int. Cl.
*G11B 5/64* (2006.01)
*B32B 15/04* (2006.01)
*B01J 20/22* (2006.01)
*H01L 51/52* (2006.01)
*B01J 20/02* (2006.01)
*H01L 23/26* (2006.01)

(52) U.S. Cl.
CPC ............ *H01L 51/5237* (2013.01); *B01J 20/02* (2013.01); *B01J 20/22* (2013.01); *H01L 23/26* (2013.01); *H01L 2924/0002* (2013.01)
USPC ........... 428/336; 428/457; 428/704; 428/524; 502/401; 502/402

(58) Field of Classification Search
None
See application file for complete search history.

(56) References Cited

U.S. PATENT DOCUMENTS 4,444,821 A 4/1984 Young et al.
5,505,810 A 4/1996 Kirby et al.
(Continued)

FOREIGN PATENT DOCUMENTS

| CN | 1239396 | 12/1999 |
| CN | 1556028 | 12/2004 |

(Continued)

OTHER PUBLICATIONS

JP Second Examination Report issued Nov. 2, 2010 from the Japanese Patent Office in counterpart JP Application No. 2008-523548. (English Translation attached).

(Continued)

*Primary Examiner* — Ellen S Wood
*Assistant Examiner* — Anthony J Frost
(74) *Attorney, Agent, or Firm* — Steinfl & Bruno LLP

(57) ABSTRACT

Getter systems are provided including one or more deposits of getter materials, wherein at least one of the deposits is in contact with a layer of a material having $H_2O$ transport properties.

24 Claims, 4 Drawing Sheets

(56) References Cited

U.S. PATENT DOCUMENTS

| | | | |
|---|---|---|---|
| 5,882,761 A | 3/1999 | Kawami et al. | |
| 5,885,682 A | 3/1999 | Tanimoto et al. | |
| 6,001,449 A * | 12/1999 | Hunter et al. | 428/68 |
| 6,146,225 A * | 11/2000 | Sheats et al. | 445/24 |
| 6,226,890 B1 | 5/2001 | Boroson et al. | |
| 6,465,953 B1 * | 10/2002 | Duggal | 313/553 |
| 6,833,668 B1 | 12/2004 | Yamada et al. | |
| 2003/0011047 A1 * | 1/2003 | Cunningham et al. | 257/614 |
| 2003/0017371 A1 * | 1/2003 | Burrows et al. | 428/697 |
| 2003/0110981 A1 | 6/2003 | Tsuruoka et al. | |
| 2004/0051449 A1 * | 3/2004 | Klausmann et al. | 313/512 |
| 2004/0108811 A1 * | 6/2004 | Klausmann et al. | 313/512 |
| 2004/0124763 A1 * | 7/2004 | Nathan et al. | 313/498 |
| 2004/0180236 A1 | 9/2004 | Nishii et al. | |
| 2004/0201347 A1 | 10/2004 | Park et al. | |
| 2004/0201447 A1 | 10/2004 | Wong | |
| 2005/0040759 A1 * | 2/2005 | Kobayashi | 313/506 |
| 2005/0045900 A1 | 3/2005 | Silvernail | |
| 2005/0064154 A1 * | 3/2005 | Aylward et al. | 428/195.1 |
| 2005/0241483 A1 | 11/2005 | Okada et al. | |

FOREIGN PATENT DOCUMENTS

| | | | |
|---|---|---|---|
| EP | 0757920 | 2/1997 | |
| EP | 1292173 A1 | 3/2003 | |
| JP | 11-329719 A | 11/1999 | |
| JP | 2001126862 | 5/2001 | |
| JP | 2002-280166 A | 9/2002 | |
| JP | 2004186043 A | 7/2004 | |
| JP | 2004-342515 A | 12/2004 | |
| JP | 2005123089 A | 5/2005 | |
| JP | 2005166496 A | 6/2005 | |
| TW | 326406 | 2/1998 | |
| TW | 511391 | 11/2002 | |
| TW | 575654 | 2/2004 | |
| TW | 200401662 | 2/2004 | |
| TW | 587396 | 5/2004 | |
| TW | 200507924 | 3/2005 | |
| WO | 0131717 A1 | 5/2001 | |
| WO | 01/54450 | 7/2001 | |
| WO | 2004/072604 | 8/2004 | |
| WO | 2005/050736 A1 | 6/2005 | |
| WO | WO 2005050736 A1 * | 6/2005 | H01L 23/26 |
| WO | 2007/013120 | 2/2007 | |

OTHER PUBLICATIONS

Prosecution history of EP Application No. 06766390.6, dated Jul. 14, 2009 through Jan. 12, 2012.

Office Action issued Dec. 23, 2009 in KR Application No. 10-2007-7030339.

Prosecution history of JP Application No. 2008-523548, dated Jun. 22, 2010 through Nov. 29, 2011.

Office Action issued Apr. 7, 2009 in RU Application No. 2008107724.

Prosecution history of SG Application No. 200800421-0, dated Dec. 18, 2008 through May 26, 2009.

Office Action mailed on May 10, 2013 for application No. TW095126804 filed on Jul. 21, 2006 in the name of Saes Getters Spait (Chinese original and English translation).

International Search Report mailed on May 10, 2013 for application No. TW095126804 filed on Jul. 21, 2006 in the name of Saes Getters Spait (Chinese original and English translation).

PCT International Search Report mailed on Nov. 6, 2006 for PCT Application PCT/IT2006/000546 filed on Jul. 19, 2006 in the name of Saes Getters S.P.A.

PCT Written Opinion mailed on Nov. 6, 2006 for PCT Application PCT/IT2006/000546 filed on Jul. 19, 2006 in the name of Saes Getters S.P.A.

PCT International Preliminary Report on Patentability completed on Oct. 30, 2007 for PCT Application PCT/IT2006/000546 filed on Jul. 19, 2006 in the name of Saes Getters S.P.A.

Office Action mailed on Jan. 29, 2014 for application No. TW095126804 filed on Jul. 21, 2006 in the name of Saes Getters SPA IT (English and Chinese).

* cited by examiner

GETTER SYSTEMS COMPRISING ONE OR MORE DEPOSITS OF GETTER MATERIAL AND A LAYER OF MATERIAL FOR THE TRANSPORT OF WATER

CROSS-REFERENCE TO RELATED APPLICATIONS

This application is a Section 371 of International Application No. PCT/IT2006/000546, filed Jul. 19, 2006, which was published in the English language on Feb. 1, 2007, under International Publication No. WO 2007/013120, the disclosure of which is incorporated herein by reference.

BACKGROUND OF THE INVENTION

The present invention relates to getter systems comprising one or more deposits of getter material, wherein at least one of the deposits is in contact with a layer of a material having $H_2O$ transport properties.

The getter materials and systems are widely used in industry in all applications where it is necessary to maintain a vacuum or to control the composition of the gaseous atmosphere through the absorption of traces of undesired gases.

Getter materials widely used in industrial production are some metals such as titanium, zirconium, niobium, vanadium or hafnium or alloys thereof (and in particular, the zirconium- and titanium-based alloys), which are useful for the absorption of small molecules such as hydrogen, oxygen, water, carbon oxides, and in some cases nitrogen. However, these materials have the limitation of requiring relatively high temperatures (generally higher than 300° C.) for the activation of the getter function, which makes them unsuitable for the use in some devices, for instance those including organic materials.

Examples of applications where it is not possible to resort to thermal activation are panels for thermal insulation filled with polymer foams, as described for instance in U.S. Pat. No. 4,444,821; U.S. Pat. Nos. 5,505,810 and 5,885,682; or OLED screens, described for instance in U.S. Pat. No. 5,882,761.

Another particularly interesting application for getter materials is in microelectromechanical systems, better known in the field by the acronym MEMS, with particular reference to those MEMS comprising an interface with the external environment made of a transparent element; by way of example, the DMDs (from Digital micro Mirror Device) are mentioned.

Among the getter materials which require thermal activation only at relatively low temperatures (compatible with the electroluminescent organic materials which form the active element of the screens using multilayers of electroluminescent organic materials, known in the field as OLEDs), some porous materials, such as active carbons can be mentioned, useful particularly for the absorption of organic substances, or zeolites, silica or alumina, which are useful for the absorption of small-size gaseous molecules. Materials not requiring thermal activation are the anhydrous chemical desiccants, specific for the absorption of moisture, such as the oxides of the alkaline-earth metals, or some hygroscopic salts, such as chlorides (e.g. calcium chloride, $CaCl_2$), perchlorates (e.g. magnesium perchlorate, $Mg(ClO_4)_2$), or sulfates (e.g. calcium sulfate, $CaSO_4$).

Because of the importance of this application, in order to exemplify the uses of the getter systems of the invention, reference will be made in particular to the use in OLEDs, but the getter systems of the invention are for general utilization and can be used also in the applications where metals and metal alloys mentioned above are normally used.

The organic multilayer elements arranged inside OLED screens are very sensitive to the presence of gas traces, in particular to humidity which can give rise to two different types of degradation phenomena:

reduction of the screen life due to an attenuation of brightness with time, this phenomenon being associated with the amount of gaseous impurities responsible for the degradation which are present in the proximity of the organic materials multilayer. This type of phenomenon is caused by a concentration of such gaseous impurities being capable of triggering irreversible phenomena of degradation of the organic materials; and tendency to a spatial non-homogeneity of brightness, this phenomenon being connected to non-uniformity of the concentration of the impurities, with particular emphasis on non-uniformity in the distribution of the concentration of $H_2O$ permeating mainly through the adhesive that is used for sealing the OLED cavity. This phenomenon is particularly insidious, as it can appear in relatively short times, and the only way for avoiding the onset thereof is to guarantee a $H_2O$ concentration which is as uniform as possible inside the cavity.

A technological solution capable of solving the problems related to the presence of gaseous impurities inside OLED screens thus must guarantee, in correspondence to the electroluminescent organic materials multilayer, low levels of $H_2O$ and a concentration thereof being as uniform as possible.

A satisfactory technical solution for OLED screens has not been found yet. For instance, in U.S. Pat. No. 6,833,668 B1 there is described the use of a resin, containing a getter material, being used for sealing the OLED cavity. However, this solution is not able to guarantee uniformity of the $H_2O$ concentration.

Another approach is described in the International patent application publication WO2005/050736, which discloses means to adhere a getter composition to an inner surface of electronic devices, where the getter is in particle form dispersed in a suitable binder and a liquid medium.

A different solution is shown in Japanese patent application publication JP 2004-186043, where a distributed deposit of getter material is used along the whole peripheral edge of the active surface of the screen, thus creating a sort of frame of getter material acting as a barrier against the entry of impurities. Also in this case, it is not possible to guarantee a uniform $H_2O$ concentration in correspondence to the organic multilayer. Such a concentration is in fact inevitably higher at the center of the device compared to the edge.

Still another known solution is the one described in the U.S. patent application publication 2004/0201347 A1, whose most general embodiment is schematically shown in FIG. 1. The OLED screen 10 consists of a lower substrate 11, an electroluminescent active multilayer 12 being formed on a surface of the substrate 11, and a transparent front panel 13 being coupled by means of spacers 15, 15' to the lower substrate. Lower substrate 11, front panel 13 and spacers 15, 15' define an inner cavity 14. The front panel 13 has, on its internal surface, a coating made with an $H_2O$ absorber 16, in order to remove the impurities which succeed in diffusing within the internal cavity 14. The absorber 16 is transparent as it must be able to transmit to the outside the light radiation produced by the electroluminescent organic multilayer 12 through the front panel 13.

The electroluminescent organic multilayer 12, in order not to introduce useless complexity into the drawing, is exemplified with a simple rectangle, even though it consists of an assembly of elements, among which are a first series of electrodes, an organic multilayer and a second series of electrodes, which are sequentially stacked. This technical solution is potentially capable of solving the aforementioned problems associated with the permeation of $H_2O$ and $O_2$, having an absorber of impurities arranged in the proximity of the organic multilayer, and the layer of absorbing material having a larger extension than the deposit of organic multilayer 12. The main problem with this previously shown technical solution is that, by reaction with the gas to be absorbed, the getter material generally undergoes structural and morphological modifications, for instance swellings, which particularly in the case of the desiccants can be remarkable. Further, as a consequence of the gas absorption, the getter material or the whole system containing the same can undergo other undesired modifications, such as the loss of transparency.

BRIEF SUMMARY OF THE INVENTION

An object of the present invention is thus to provide a getter system being capable of overcoming the problems which are still present in the prior art. In a first aspect of the invention is a getter system comprising:

one or more deposits of getter material, at least one of which comprises a getter being capable of absorbing $H_2O$; and a layer of transparent material for transport of $H_2O$, the layer of transparent material being arranged in contact with at least one of the getter deposits comprising a getter which is capable of absorbing $H_2O$.

In a second aspect thereof, the invention is a getter system for OLED screens comprising:

one or more deposits of getter material, at least one of which comprises a getter being capable of absorbing $H_2O$, which are arranged laterally with respect to the deposit of electroluminescent organic multilayer; and a layer of transparent material for transport of $H_2O$ being arranged in front of the electroluminescent organic multilayer, the layer of transparent material having an area which is not smaller than the area of the deposit of electroluminescent organic multilayer and being arranged in contact with at least one of the getter deposits comprising a getter capable of absorbing $H_2O$.

The arrangement of the layer of transparent material with $H_2O$ transport function being present inside the OLED screen allows a broader selection of getter materials. In fact, it is not necessary for them to be transparent, as the previously described arrangement places such materials out of the optical path of the radiation being emitted from the screen.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

Figure 1:
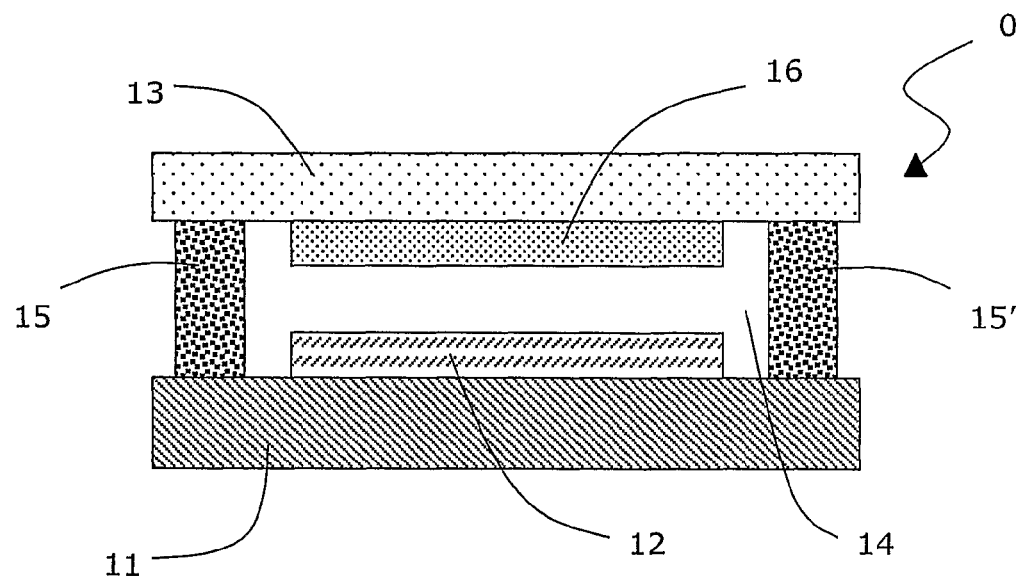
FIG. 1 is a schematic, sectional view of an OLED containing a getter system according to the prior art.

The dimensions and the dimensional ratios of the various elements being shown in the drawings are not correct, and in particular the thickness of some elements has been greatly enlarged in order to make the drawings easier to be interpreted.

DETAILED DESCRIPTION OF THE INVENTION

FIG. 1 shows a getter system for OLEDs according to the prior art and has been described previously.

The getter systems of the present invention differ from those of the prior art in that inside the cavity of the screen there is a material having the specific function of capturing $H_2O$ in the proximity of the element sensitive thereto (the electroluminescent organic multilayer) and transporting the $H_2O$ to the getter material for allowing the absorption thereof.

This allows solution of the problems which are still present with the solutions of the prior art. With the present invention two components are used: the getter with the specific function of lowering the concentration of gaseous impurities by absorption thereof, and a layer of material having an area equal to or larger than that of the electroluminescent organic multilayer, whose function is to take the water in gaseous phase present in the proximity of the organic multilayer and transporting it to the getter material. Such a layer allows a uniform concentration of $H_2O$ to be obtained inside the screen.

The point, or to be more precise, the surface of contact between the getter material and the transport material is the region where the $H_2O$ is transferred from the transport material to the getter material.

Getter materials suitable for carrying out the invention can be materials having the capability of removing all the harmful gaseous impurities, such as $H_2O$, $H_2$, $O_2$, hydrocarbons, $N_2$, $CO$, $CO_2$, or it is possible to use mixtures of materials, each being capable of absorbing one or more harmful gaseous compounds. In any case, at least one portion of a getter deposit must contain a material capable of removing $H_2O$ and be in contact with the transport layer of the same.

This kind of solution has the advantage of modulating the composition of the deposits of getter material on demand. The OLED screens and the MEMS can be produced with various materials sensitive to different gaseous species, whereby, depending on the type of device, it is possible to choose the best getter composition for the deposits.

Further, the fact that the getter material must accomplish the sole function of removing the impurities and not deal also with the uniformity of the distribution of $H_2O$ in the proximity of the organic multilayer, allows the material to be placed in a lateral position with respect to the organic multilayer and thus does not intercept the emitted light radiation. This allows a broader selection of usable materials, as it is not necessary that the getter material have and maintain over time features of transparency, even upon absorption of impurities.

Thus, the getter being arranged in peripheral position can be selected among those which specifically absorb water or oxygen or hydrocarbons or carbon monoxide or carbon dioxide or nitrogen or hydrogen and its isotopes or other harmful contaminants.

Among the getters usable for the absorption of water are zeolites, silica or alumina, oxides of alkaline metals, oxides of alkaline-earth metals, oxides of nickel, zinc and cadmium, some hygroscopic salts, such as chlorides (e.g. calcium chloride, $CaCl_2$), perchlorates (e.g. magnesium perchlorate, $Mg(ClO_4)_2$), or sulfates (e.g. calcium sulfate, $CaSO_4$), various organic compounds, in the presence of Lewis or Broensted acid or basic catalysts, such as the epoxides, organic molecules with double or triple bonds, compounds forming carbocations, anhydrides, alkoxides, and acylic halides.

Among the getters usable for the absorption of oxygen are metals which are easily oxidized, such as alkaline metals, alkaline-earth metals or other metals such as iron, tin and copper, low oxidation state metal oxides, such as manganese and copper oxides, salts with phosphite or phosphonite anion, and organic compounds which are easily oxidized, such as phenols, secondary aromatic amines, thioethers and aldehydes.

Among the getters usable for the absorption of hydrocarbons are zeolites and active carbons.

Among the getters usable for the absorption of carbon monoxide are some metals, such as nickel and iron, some organic compounds, such as alkenes, amines and ketones in the presence of lithium-based organometallic compounds.

Among the getters usable for the absorption of carbon dioxide are the hydroxides of alkaline or alkaline-earth metals.

Among the getters usable for the absorption of nitrogen are lithium, barium, $BaLi_4$ compound and porphyrins.

Among the getters usable for the absorption of hydrogen and its isotopes are palladium, palladium oxide, yttrium, titanium, zirconium, and alloys of titanium or zirconium with vanadium, iron, molybdenum, aluminum, chrome, tungsten, niobium, nickel, and manganese.

As far as the layers that must accomplish the task of transporting $H_2O$ are concerned, these are of two possible types, differing in the transport mechanism:
  layers performing $H_2O$ surface transport;
  layers absorbing $H_2O$ and performing $H_2O$ bulk transport.

As far as layers for $H_2O$ surface transport are concerned, they work on the principle of bonding $H_2O$ molecules present in the gas phase and allowing their movement onto the layer surface towards the getter. The efficiency of these layers in bonding water on the surface depends on the sticking probability of the material making up the layer and on the hydrophilic behavior of the surface. The sticking probability (s) of the material represents the probability that, in case a water molecule present in gaseous phase hits the surface of the material, it is bound to the same surface; s>0.1 is considered a high sticking probability. The sticking probability generally depends on the chemical nature of the surface, but also on the surface structure, in particular on the roughness of the same. A high sticking probability corresponds to a high roughness (0.05 μm Ra is considered a high roughness). The higher the sticking probability and the stronger the hydrophilicity of the material, the higher is the adsorption of $H_2O$.

The hydrophilic behavior and the sticking probability of the surface generally increase when the dispersive forces and the polar forces established between surface and water increase. The hydrophilic behavior of a surface is also high, and above all, when the surface is capable of forming hydrogen bonds with water. Thus, generally, all materials exposing at the surface polar groups comprising oxygen and/or nitrogen and/or sulfur and/or phosphorus, in particular —OH, —SH, —SO, —PO groups, have to be considered suitable. The hydrophilic behavior is generally translated into a given surface energy. The surface energy of water is equal to 72 mN/m. The closer the surface energy of the material to the surface energy of water, the stronger is the hydrophilic behavior of this surface. Surfaces having surface energies higher than 45 mN/m are considered to be surfaces having strong hydrophilic behavior.

Among the materials usable as surface transport elements are all hydrophilic polymer materials (laid in the shape of thin film, with thickness less than about 10 nm, for instance by means of spin coating; in this case the transport of water molecules is essentially of the surface type, because such thin films have no bulk), namely polyacrylates and polymethacrylates, polyetherimides (PEI), polyamides (PA), cellulose acetate (CA), cellulose triacetate (TCA), polysiloxanes (also known as silicones), polyvinyl alcohol (PVAL), polyethylene oxide (PEO), polyethylene glycol (PEG), polypropylene glycol (PPG), polyvinyl acetate (PVAC), polyoxymethylene (POM), poly(ethylene vinyl alcohol) copolymers (EVAL, EVOH), poly(amide-ethylene oxide) copolymers (PA-PEO), poly(urethane-ethylene oxide) copolymers (PUR-PEO), poly (ethylene-vinyl acetate) copolymers (EVA, EVAC).

Other hydrophilic materials usable for producing a surface transport element are the nanosized oxides (average particle size d=1÷200 nm), prepared by sol-gel techniques or by spray flame pyrolysis and deposited in the form of thin film (thickness≤1000 nm), for instance by screen-printing techniques. Oxides usable for this purpose are $In_2O_3$, ZnO, $SnO_2$, $TiO_2$, $WO_3$, and mixtures thereof.

The deposits of nanosized particles can also be treated by UV radiation or by ion bombardment for the creation of surface roughness, dangling bonds and lattice holes. UV radiation and ion bombardment can be carried out in the presence of oxygen or water vapor or the previously treated surfaces can be successively exposed to oxygen or water.

Surface $H_2O$ transport layers, as described above, can be deposited onto the surfaces of the OLED cavity other than the polymeric multilayer, which is the element active in the light emission phenomenon. For convenience, these layers are preferably deposited, along with the getter material to which they convey $H_2O$, onto the transparent window of the device, with the transport layer that can directly face the multilayer, while the getter material is positioned laterally with respect thereto.

In addition to the above cited materials, having inherently hydrophilic behavior, it is also possible to use many others polymeric materials not normally considered hydrophilic or known as hydrophobic, provided they are subjected to a suitable treatment that changes the properties of their surface making this latter hydrophilic. Hydrophobic materials are those materials whose surface energy is <30 mN/m, such as PTFE (surface energy=18 mN/m). The treatments to change the properties of the surfaces of hydrophobic materials to hydrophilic are, e.g., oxidative treatments in flame, in corona discharge or in plasma in the presence of oxygen or water vapor. An etching treatment performed by ion bombardment (e.g. argon, 0.5-5 keV energies, $1\times10^{12}$–$1\times10^{18}$ ions/cm$^2$ doses) is also effective. All these treatments determine the erosion of the surface of the polymeric material (with an increase in the roughness and in the sticking probability), the creation of dangling bonds (surface non-saturations) and the formation of —O and —OH groups, because of the presence of oxygen or water during the treatment.

Polymeric materials that can be used in this case are, e.g., polyethylene (PE), polypropylene (PP), polycarbonate (PC), polymethylmethacrylate (PMMA), polystyrene (PS), polyethylene terephthalate (PET), polytetrafluoroethylene (PTFE), and polyimides (PI).

In this case, the overall thickness of the polymeric layer may be relatively high, e.g., higher than 1000 nm, while the thickness of the hydrophilic surface is generally of only a few monolayers, thus in the range of nanometers.

Surface H$_2$O transport materials of this latter kind can be positioned over the transparent window of the device, but also adhered directly to the organic multilayer which is active in light emission, provided the surface of the transport layer made hydrophilic is not the one contacting the organic multilayer.

In an alternative embodiment, the layer transporting water towards the getter is made in such a way that the transport takes place in the bulk of the material making up the layer.

For a given quantity of material forming the layer (determined by the thickness, length and width of the parallelepiped being deposited on the OLED or MEMS front substrate), the higher the solubility (S) of the material, the higher is the H$_2$O absorption.

For a given geometry of the layer, the speed at which it is capable of transporting water is proportional to the diffusion coefficient (D) of the material it is made of.

Since the permeability (P) of a material is defined as P=S× D, it is possible to define the preferred materials for the production of a mass transport element as those materials having a permeability higher than $1\times10^{-12}$ (m$_{(STP)}$$^3$·m$^2$/bar·m$^3$·s) (m$_{(STP)}$$^3$ stands for cubic meters of gas measured at standard temperature and pressure). Materials strongly permeable to water are also strongly hydrophilic.

The preferred material for the production of this layer is of a polymer type. Among the possible polymer materials usable and among the manufacturing processes thereof, the ones that allow obtaining the maximum free volume of the polymer medium, the maximum order and regularity of the polymer chains, the minimum degree of cross-linking, the minimum packing density, and the maximum interactions with the permeating species, must be preferred.

The preferred materials for producing the bulk water transport layer are the same hydrophilic polymeric materials listed previously for the production of the surface transport layer. In this case, however, the characteristic thickness of the layer is higher than in the case of surface transport layers, typically in the range of hundreds or thousands of nanometers.

Figure 2:
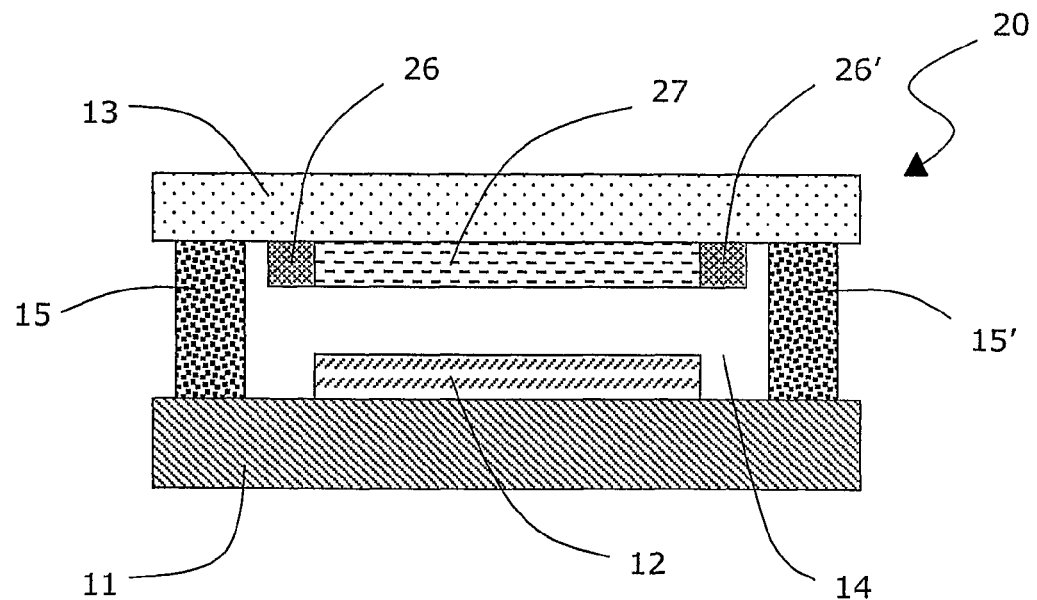
FIG. 2 is a schematic, sectional view of an OLED containing a getter system made according to an embodiment of the invention.

FIG. 2 shows a first embodiment of a getter system for OLED 20, according to the present invention. The difference with respect to the elements of the prior art, already described when discussing FIG. 1 (the same reference numerals in FIG. 1, FIG. 2 and the subsequent Figures indicate the same elements), consists in the deposits of getter material 26, 26' being arranged on the internal surface of the front substrate 13 in a lateral position with respect to the organic multilayer 12, which is arranged on the surface of the lower substrate 11. Further the getter deposits are connected to a layer of transparent material 27, with properties of absorption and transmission of the impurities.

The surface of exchange of the impurities between the transparent layer and the getter material is represented by the contact surface between layer 27 and the getter deposits 26, 26'. This type of geometry is suitable for transparent layers transporting H$_2$O inside them (bulk transport).

Figure 3:
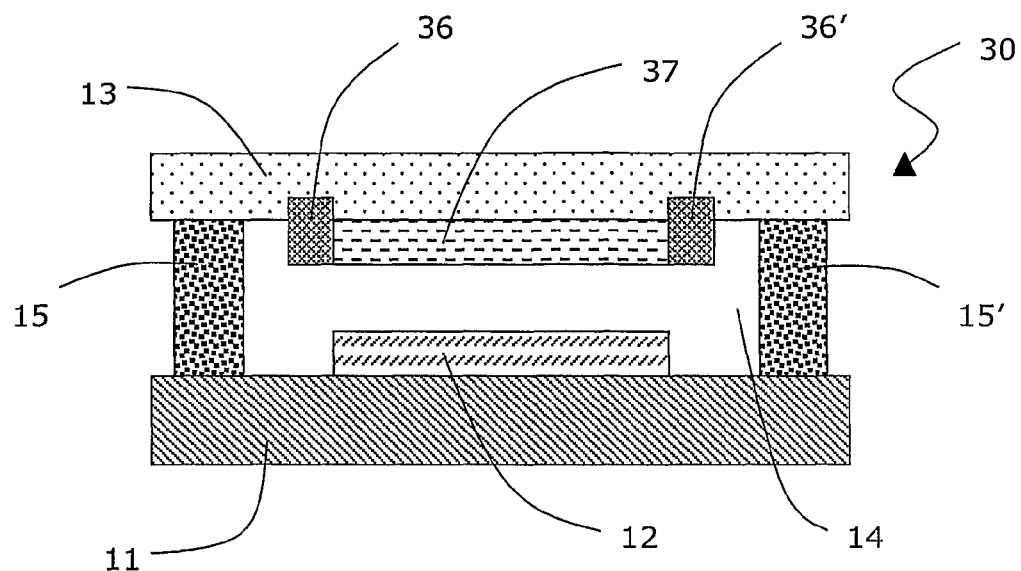
FIG. 3 is a schematic, sectional view of an OLED containing a getter system with maximum capacity, made according to another embodiment of the invention.

A particularly interesting variation is shown in FIG. 3. In this case, the getter system for OLED 30 comprises getter deposits 36, 36' extending partially inside the upper substrate 13 and connected to the transport layer 37. This type of solution is particularly useful when it is desired to increase the gettering capacity of the system, which is obviously related to the quantity of material with gettering action included in the cavity 14. This geometry is also particularly suitable when bulk transport layers are used.

With respect to what is shown in FIGS. 2 and 3 and previously described, there are some possible variations which do not modify in any way the purpose or the functionality of the system. In particular, there could be only one of the two getter deposits, or the getter deposits could be made of the same material or of different materials. In this latter case, a deposit could be formed by a material capable of absorbing only H$_2$O, with the other capable of sorbing all other impurities.

Figure 4:
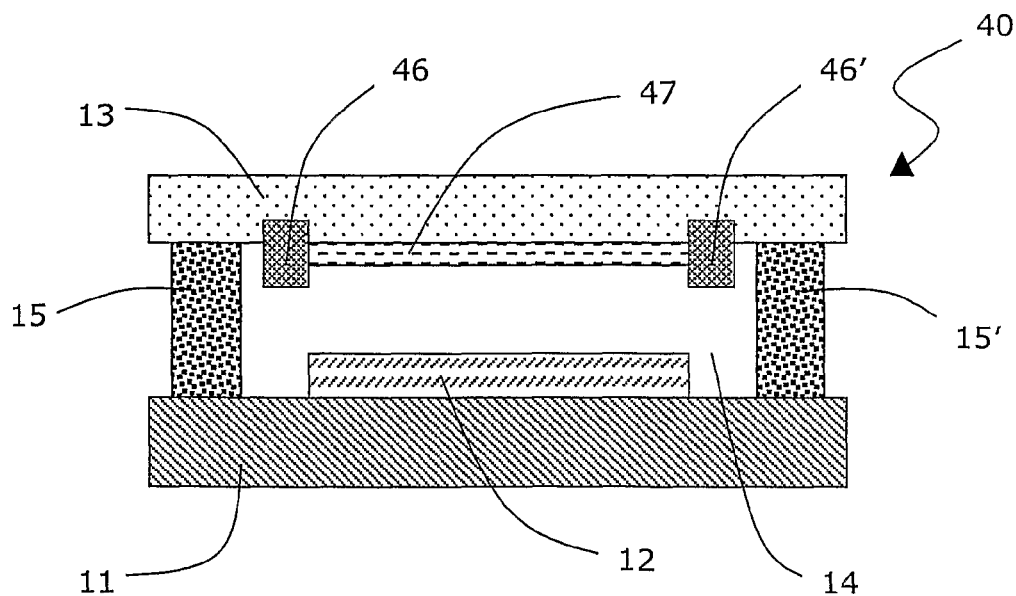
FIG. 4 is a schematic, sectional view of an OLED containing a getter system made according to another embodiment of the invention with a mechanism of surface transport of $H_2O$.

As shown in the getter system for OLED 40 illustrated in FIG. 4, the height of the transport layer and of the getter material might also be different, in particular in this case, the thickness of the transport layer 47 is remarkably low with respect to the thickness of the deposits of getter materials 46, 46'. This type of solution is preferred in layers which work according to the surface transport mechanism.

Figure 5:
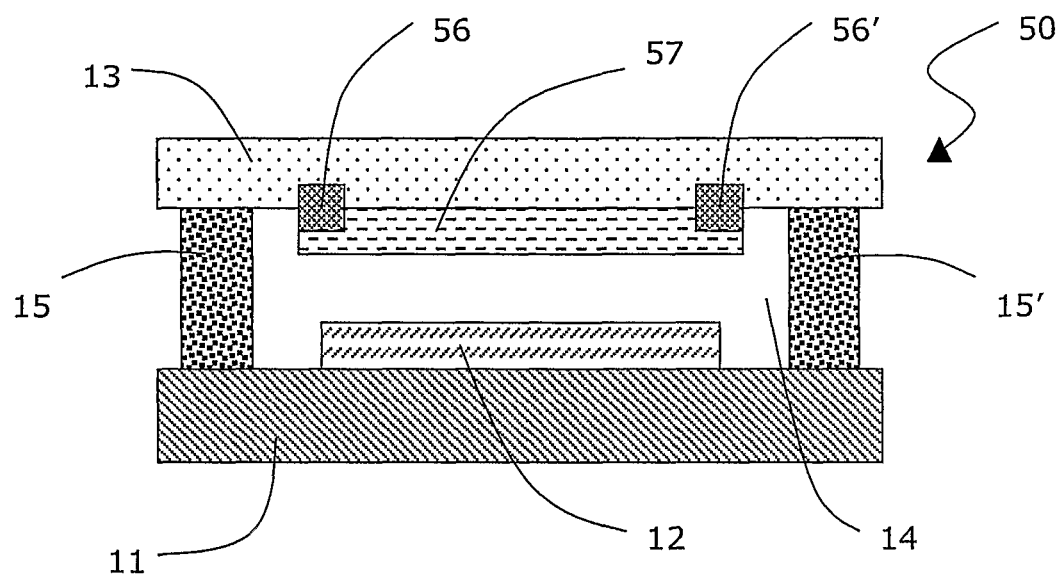
FIG. 5 is a schematic, sectional view of an OLED containing a getter system made according to a further embodiment of the invention, which maximizes the exchange between the getter material and the transport layer.

FIG. 5 shows in cross-section a getter system for OLED 50, maximizing the contact surface and thus the exchange between the H$_2$O transport layer 57 and the deposits of getter material 56, 56'. This type of embodiment is the preferred one in the case of bulk transport of H$_2$O inside the material.

Figure 6:
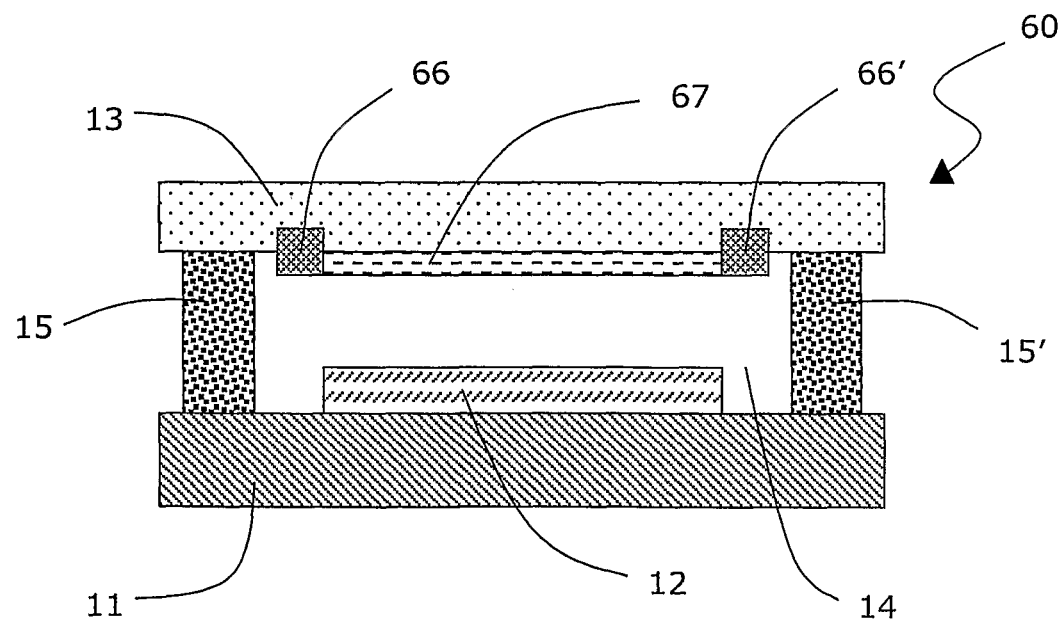
FIG. 6 is a schematic, sectional view of an OLED containing a getter system made according to a still further embodiment of the invention, with a mechanism of surface transport of $H_2O$, which minimizes the volume and the thickness of the same.

FIG. 6 shows another OLED 60, in which the configuration of the getter system is interesting for the case where the water is conveyed by the layer 67 to the deposits of getter material 66, 66' according to the surface transport mechanism. The illustrated configuration is such as to minimize the volume and the thickness of the getter system.

Figure 7:
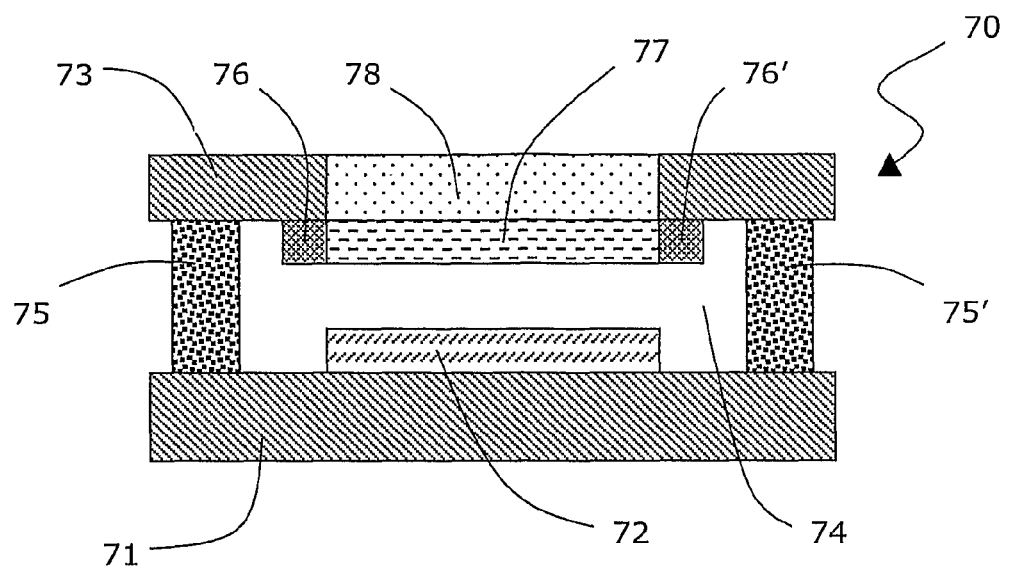
FIG. 7 is a schematic, sectional view of a MEMS containing a getter system made according to one embodiment of the invention.

The various configurations shown for OLED screens are also usable in the case of MEMS 70, as shown in FIG. 7. Also in this case, there is a cavity 74 defined by two substrates 71, 73 reciprocally sealed by the elements 75, 75', including an active element 72, which is sensitive to the presence of gaseous impurities and particularly sensitive to the presence of H$_2$O. For instance, the active element 72 can be a series of reflective micro mirrors, as in the case of the DMDs.

Unlike the case of the OLEDs, only a portion 78 of the upper substrate 73 is transparent. Similarly to what is shown in FIG. 2, the deposits of getter material 76, 76' are on the upper substrate, laterally with respect to the active element and to the transparent window, and the deposits are connected by a layer of material 77 for the transport of H$_2$O.

All considerations and configurations for OLEDs shown in FIGS. 3-6 can be applied to the case of MEMS.

Figure 8:
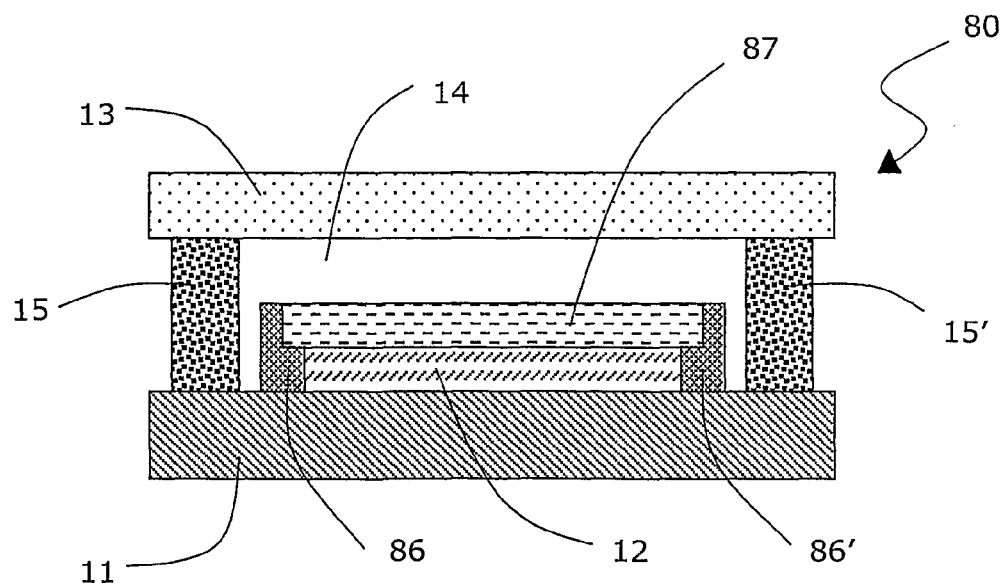
FIG. 8 is a schematic, sectional view of an OLED containing a getter system made according to an embodiment of the invention, with a mechanism of surface transport of $H_2O$.

Finally, FIG. 8 shows another possible positioning of a getter system according to the invention, suitable for use in an OLED 80. In this case, the getter system is formed by getter deposits 86, 86', in contact with the transport layer 87. The latter is made of a hydrophobic material whose surface facing the cavity 14 has been treated so as to render it hydrophilic. The transport of water in this case takes place along the surface of layer 87 and towards the deposits 86, 86', while the bulk of layer 87 acts as a barrier against the penetration into the organic multilayer 12 of water molecules present in cavity 14.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An active element with getter system comprising a cavity, at least one deposit of getter material comprising a getter capable of absorbing moisture, and a layer of hydrophilic transparent material for transport of moisture, wherein the layer of hydrophilic transparent material is arranged completely within the cavity and in contact with at least one of the deposits comprising a getter capable of absorbing moisture, wherein the active element is not in direct contact with the getter material or with the layer of hydrophilic transparent material, wherein the getter material has a higher capacity for water than the hydrophilic transparent material configured such that moisture would be transferred from the hydrophilic transparent material to the getter material, and wherein the layer of hydrophilic transparent material comprises a material selected from the group consisting of:
   a) polyacrylates, polymethacrylates, polyetherimides (PEI), polyamides (PA), cellulose acetate (CA), cellulose triacetate (TCA), polysiloxanes, polyvinyl alcohol (PVAL), polyethylene oxide (PEO), polyethylene glycol (PEG), polypropylene glycol (PPG), polyvinyl acetate (PVAC), polyoxymethylene (POM), poly(ethylene vinyl alcohol) copolymers (EVAL, EVOH), poly(amid-ethylene oxide) copolymers (PA-PEO), poly(urethane-ethylene oxide) copolymers (PUR-PEO), and poly(ethylene-vinyl acetate) copolymers (EVA, EVAC);
   b) hydrophobic polymers selected from polyethylene (PE), polypropylene (PP), polycarbonate (PC), polymethylmethacrylate (PMMA), polystyrene (PS), polyethylene terephthalate (PET), polytetrafluoroethylene (PTFE), and polyimides (PI), wherein the hydrophobic polymer has undergone surface treatment to make it hydrophilic; and
   c) nano-sized oxides.

2. The getter system according to claim 1, wherein the getter capable of absorbing moisture is selected from zeolites, silica, alumina, oxides of alkaline metals, oxides of alkaline-earth metals, oxides of nickel, zinc and cadmium, chlorides, perchlorates, sulfates, epoxides, organic molecules with double and triple bonds in the presence of Lewis or Broensted acid or basic catalysts, compounds forming carbocations, anhydrides, alkoxides, and acyclic halides.

3. The getter system according to claim 1, wherein at least one of the deposits of getter material comprises a getter for oxygen.

4. The getter system according to claim 3, wherein the getter for oxygen is selected from alkaline metals, alkaline-earth metals, metal selected from iron, tin and copper, manganese and copper oxides, salts with phosphite or phosphonite anion, phenols, secondary aromatic amines, thioethers, and aldehydes.

5. The getter system according to claim 1, wherein at least one of the deposits of getter material comprises a getter for hydrocarbons.

6. The getter system according to claim 5, wherein the getter for hydrocarbons is selected from zeolites and active carbons.

7. The getter system according to claim 1, wherein at least of one of the deposits of getter material comprises a getter for CO.

8. The getter system according to claim 7, wherein the getter for CO is selected from nickel, iron, alkenes, amines, and ketones in the presence of lithium-based organometallic compounds.

9. The getter system according to claim 1, wherein at least one of the deposits of getter material comprises a getter for $CO_2$.

10. The getter system according to claim 9, wherein the getter for $CO_2$ is selected from hydroxides of alkaline metals and hydroxides of alkaline-earth metals.

11. The getter system according to claim 1, wherein at least one of the deposits of getter material comprises a getter for $H_2$.

12. The getter system according to claim 11, wherein the getter for $H_2$ is selected from palladium, palladium oxide, yttrium, titanium, zirconium, and alloys of titanium or zirconium with metals selected from vanadium, iron, molybdenum, aluminum, chrome, tungsten, niobium, nickel, and manganese.

13. The getter system according to claim 1, wherein at least one of the deposits of getter material comprises a getter for $N_2$.

14. The getter system according to claim 13, wherein the getter for $N_2$ is selected from lithium, barium, $BaLi_4$ compound, and porphyrins.

15. The getter system according to claim 1, wherein the layer of hydrophilic transparent material for transport of moisture transports moisture according to a surface transport mechanism.

16. The getter system according to claim 15, wherein the hydrophilic transparent material is selected from hydrophobic polymers selected from polyethylene (PE), polypropylene (PP), polycarbonate (PC), polymethylmethacrylate (PMMA), polystyrene (PS), polyethylene terephthalate (PET), polytetrafluoroethylene (PTFE), and polyimides (PI).

17. The getter system according to claim 16, wherein the hydrophobic polymers have undergone surface treatments selected from an oxidative treatment in flame, an oxidative treatment in corona discharge, an oxidative treatment in flame, an oxidative treatment in corona discharge, an oxidative treatment in plasma in the presence of oxygen or water vapor, and an etching treatment by ion bombardment.

18. The getter system according to claim 15, wherein the hydrophilic transparent material is selected from nano-size oxides.

19. The getter system according to claim 18, wherein the nano-sized oxides are selected from $In_2O_3$, $ZnO$, $SnO_2$, $TiO_2$, $WO_3$, and mixtures thereof.

20. The getter system according to claim 18, wherein the nano-sized oxides have been treated by UV radiation or ion bombardment.

21. The getter system according to claim 1, wherein the layer of hydrophilic transparent material for transport of moisture transports moisture according to a bulk transport mechanism.

22. The getter system according to claim 21, wherein the hydrophilic transparent material is selected from polyacrylates, polymethacrylates, polyetherimides (PEI), polyamides (PA), cellulose acetate (CA), cellulose triacetate (TCA), polysiloxanes, polyvinyl alcohol (PVAL), polyethylene oxide (PEO), polyethylene glycol (PEG), polypropylene glycol (PPG), polyvinyl acetate (PVAC), polyoxymethylene (POM), poly(ethylene vinyl alcohol) copolymers (EVAL, EVOH), poly(amid-ethylene oxide) copolymers (PA-PEO), poly(urethane-ethylene oxide) copolymers (PUR-PEO), and poly(ethylene-vinyl acetate) copolymers (EVA, EVAC).

23. An OLED screen comprising a getter system of claim 1, wherein the at least one deposit of getter material, at least one of which comprises a getter capable of absorbing moisture, is laterally arranged with respect to an electroluminescent organic multilayer, and the layer of hydrophilic transparent material for transport of moisture is arranged in front of the electroluminescent organic multilayer, the layer of hydrophilic transparent material having an area which is not smaller than an area of the electroluminescent organic multilayer and being arranged in contact with at least one of the getter material deposits comprising a getter being capable of absorbing moisture.

24. A MEMS comprising a getter system of claim 1, wherein the at least one deposit of getter material, at least one of which comprises a getter capable of absorbing moisture, is laterally arranged with respect to an active element, and the layer of hydrophilic transparent material for transport of moisture is arranged in front of the active element, the layer of hydrophilic transparent material having an area which is not smaller than an area of the active element and being arranged in contact with at least one of the getter material deposits comprising a getter capable of absorbing moisture.

\* \* \* \* \*